United States Patent
You et al.

(10) Patent No.: US 12,274,152 B2
(45) Date of Patent: Apr. 8, 2025

(54) DISPLAY MODULE AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventors: Kuihua You, Hubei (CN); Feiming Lin, Hubei (CN); Xiaowen Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,783

(22) PCT Filed: Dec. 17, 2021

(86) PCT No.: PCT/CN2021/139068
§ 371 (c)(1),
(2) Date: Dec. 24, 2021

(87) PCT Pub. No.: WO2023/103033
PCT Pub. Date: Jun. 15, 2023

(65) Prior Publication Data
US 2024/0040919 A1   Feb. 1, 2024

(30) Foreign Application Priority Data
Dec. 9, 2021   (CN) .......................... 202111495963.X

(51) Int. Cl.
*H10K 59/80*   (2023.01)
*B32B 7/022*   (2019.01)
(Continued)

(52) U.S. Cl.
CPC ......... *H10K 59/8794* (2023.02); *B32B 7/022* (2019.01); *B32B 15/043* (2013.01);
(Continued)

(58) Field of Classification Search
CPC ........ G02F 1/133302; G02F 1/133305; H10K 77/111; H10K 2102/311; H10K 77/10; H10K 2102/20
See application file for complete search history.

(56) References Cited

U.S. PATENT DOCUMENTS

2013/0016303 A1    1/2013  Tokunaga
2016/0190522 A1*   6/2016  Lee ..................... H10K 50/8426
                                                            257/40
(Continued)

FOREIGN PATENT DOCUMENTS

CN    106940966 A    7/2017
CN    108281576 A    7/2018
(Continued)

OTHER PUBLICATIONS

Korean Office Action issued in corresponding Korean Patent Application No. 10-2022-7009459 dated Sep. 19, 2023, pp. 1-7.
(Continued)

*Primary Examiner* — Alicia J Weydemeyer
(74) *Attorney, Agent, or Firm* — PV IP PC; Wei Te Chung

(57) ABSTRACT

A display module includes a display function layer, a display planar area, and a buffer layer. The display function layer is divided into a display segment, a compression segment, and a bending segment therebetween. The display planar area includes a compression overlapping area. A positive projection of the compression segment on the display segment covers the compression overlapping area. The buffer layer covers the compression overlapping area and is disposed on
(Continued)

a side of the display function layer away from an eminent layer of the display function layer. The buffer layer comprises a metal layer. A protective layer is disposed on a side of the buffer layer away from the display function layer. The protective layer covers the compression overlapping area. A hardness of a material for the protective layer is greater than a hardness of a material for the metal layer.

20 Claims, 6 Drawing Sheets

(51) Int. Cl.
    *B32B 15/04*     (2006.01)
    *B32B 15/18*     (2006.01)
    *B32B 15/20*     (2006.01)

(52) U.S. Cl.
    CPC .............. *B32B 15/18* (2013.01); *B32B 15/20* (2013.01); *B32B 2307/536* (2013.01); *B32B 2307/7376* (2023.05); *B32B 2457/20* (2013.01)

(56) References Cited

U.S. PATENT DOCUMENTS

| | | | | |
|---|---|---|---|---|
| 2016/0357052 | A1* | 12/2016 | Kim | .................. G02F 1/133305 |
| 2019/0371879 | A1 | 12/2019 | Li | |
| 2020/0154581 | A1 | 5/2020 | Chen | |
| 2020/0251671 | A1 | 8/2020 | Chu | |
| 2020/0264668 | A1* | 8/2020 | Baek | ........................ G06F 1/203 |
| 2021/0345037 | A1 | 11/2021 | Rhim | |

FOREIGN PATENT DOCUMENTS

| | | | |
|---|---|---|---|
| CN | 108540613 | A | 9/2018 |
| CN | 109671363 | A | 4/2019 |
| CN | 110060574 | A | 7/2019 |
| CN | 111063262 | A | 4/2020 |
| CN | 112289185 | A | 1/2021 |
| CN | 112863347 | A | 5/2021 |
| CN | 113436530 | A | 9/2021 |
| CN | 113471258 | A | 10/2021 |
| CN | 113707030 | A | 11/2021 |
| CN | 113764356 | A | 12/2021 |
| KR | 20200145934 | A | 12/2020 |
| KR | 20210083004 | A | 7/2021 |

OTHER PUBLICATIONS

International Search Report in International application No. PCT/CN2021/139068, mailed on Jul. 27, 2022.
Written Opinion of the International Search Authority in International application No. PCT/CN2021/139068, mailed on Jul. 27, 2022.
Chinese Office Action issued in corresponding Chinese Patent Application No. 202111495963.X dated Jun. 17, 2022, pp. 1-7.
Japanese Office Action issued in corresponding Japanese Patent Application No. 特願2022-526803 dated Jan. 29, 2024, pp. 1-4.

* cited by examiner

DISPLAY MODULE AND MOBILE TERMINAL

BACKGROUND

1. Field of the Disclosure

The present disclosure relates to the technical field of display, and more particularly, to a display module and a mobile terminal.

2. Description of Related Art

Currently, to achieve a better display effect, improve screen transmission, and reduce power consumption, technology that a polarizer disappears on an organ light-emitting diode (OLED) panel is developed.

Technology that a polarizer disappears on an OLED panel is called color on thin-film encapsulation (COE) technology. The principle of COE technology is to increase a color filter layer on a thin-film encapsulation (TFE) layer. While COE technology shows a better display effect, the shortcomings of the appearance of the display panel easily appears due to the matte effect of the polarizer. Since the metal material is soft due to the super clean foam (SCF) material after the display panel is bent and bound, the display panel is inclined to be deformed, and an imprint on the display panel due to deformation shows when the screen of the display device is closed, resulting in worse user experience for the display module.

SUMMARY

The present disclosure proposes a display module and a mobile terminal which offer better user experience by improving flatness and smoothness of the appearance of a display panel with color with thin-film encapsulation (COE) technology.

According to an embodiment of the present disclosure, a display module includes a display function layer, a display planar area, and a buffer layer. The display function layer is divided into a display segment, a compression segment, and a bending segment connected between the display segment and the compression segment. The display planar area includes a compression overlapping area. A positive projection of the compression segment on the display segment covers the compression overlapping area. The buffer layer covers the compression overlapping area and is disposed on a side of the display function layer away from an eminent layer of the display function layer. The buffer layer comprises a metal layer. A protective layer is disposed on a side of the buffer layer away from the display function layer. The protective layer covers the compression overlapping area. A hardness of a material for the protective layer is greater than a hardness of a material for the metal layer.

Optionally, a positive projection of the protective layer on the display segment is disposed in the display planar area of the display module. The protective layer comprises a compression portion and a supportive portion. The positive projection of the compression portion on the display segment covers the compression overlapping area.

Optionally, the thickness of the compression portion is greater than the thickness of the supportive portion.

Optionally, the display segment comprises a planar valid display portion and a bending valid display portion. The display module further comprises a display curve area. The planar valid display portion is disposed in the display planar area. The bending valid display portion is disposed in display curve area. The distance between the protective layer and the display curve area is greater than 0.1 millimeters (mm).

Optionally, the protective layer comprises a main body and a peripheral portion surrounding the main body. The thickness of the peripheral portion of the protective layer towards the periphery of the protective layer becomes smaller.

Optionally, the hardness of a material for the protective layer is greater than 150 HV.

Optionally, the display segment comprises a planar valid display portion and a bending valid display portion. The display module further comprises a display curve area. The protective layer comprises a planar portion and a bending portion; the planar portion corresponds to the planar valid display portion. The bending portion corresponds to the bending valid display portion. The curve modulus of the bending portion is greater than the curve modulus of the planar portion.

Optionally, the thickness of the bending portion is less than the thickness of the planar portion. A side of the protective layer near the display function layer is attached to the display function layer.

Optionally, a plurality of blind holes are disposed on the bending portion; an opening of the blind hole is disposed on a side of the protective layer away from the buffer layer.

Optionally, the metal layer is made of copper, and the protective layer is made of stainless steel.

According to another embodiment of the present disclosure, a mobile terminal includes a display module. The includes a display function layer, a display planar area, and a buffer layer. The display function layer is divided into a display segment, a compression segment, and a bending segment connected between the display segment and the compression segment. The display planar area includes a compression overlapping area. A positive projection of the compression segment on the display segment covers the compression overlapping area. The buffer layer covers the compression overlapping area and is disposed on a side of the display function layer away from an eminent layer of the display function layer. The buffer layer comprises a metal layer. A protective layer is disposed on a side of the buffer layer away from the display function layer. The protective layer covers the compression overlapping area. A hardness of a material for the protective layer is greater than a hardness of a material for the metal layer.

Optionally, a positive projection of the protective layer on the display segment is disposed in the display planar area of the display module. The protective layer comprises a compression portion and a supportive portion. The positive projection of the compression portion on the display segment covers the compression overlapping area.

Optionally, the thickness of the compression portion is greater than the thickness of the supportive portion.

Optionally, the display segment comprises a planar valid display portion and a bending valid display portion. The display module further comprises a display curve area. The planar valid display portion is disposed in the display planar area. The bending valid display portion is disposed in display curve area. The distance between the protective layer and the display curve area is greater than 0.1 millimeters (mm).

Optionally, the protective layer comprises a main body and a peripheral portion surrounding the main body. The thickness of the peripheral portion of the protective layer towards the periphery of the protective layer becomes smaller.

Optionally, the hardness of a material for the protective layer is greater than 150 HV.

Optionally, the display segment comprises a planar valid display portion and a bending valid display portion. The display module further comprises a display curve area. The protective layer comprises a planar portion and a bending portion; the planar portion corresponds to the planar valid display portion. The bending portion corresponds to the bending valid display portion. The curve modulus of the bending portion is greater than the curve modulus of the planar portion.

Optionally, the thickness of the bending portion is less than the thickness of the planar portion. A side of the protective layer near the display function layer is attached to the display function layer.

Optionally, a plurality of blind holes are disposed on the bending portion; an opening of the blind hole is disposed on a side of the protective layer away from the buffer layer.

Optionally, the metal layer is made of copper, and the protective layer is made of stainless steel.

The present disclosure provides more than one benefit: A protective layer is arranged on a side of the buffer layer 20 away from the display function layer 10. The protective layer 30 is arranged in a compression overlapping area T so that the protective layer 30 can prevent the metal layer 202 in the buffer layer 20 from being deformed when the display module is compressed. In this way, the appearance of the compressed display module with color with thin-film encapsulation (COE) technology becomes very attractive, and no imprint appears on the closed screen of the display device. Accordingly, the user experience of the display module is enhanced.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DETAILED DESCRIPTION OF THE EMBODIMENTS

Figure 1:
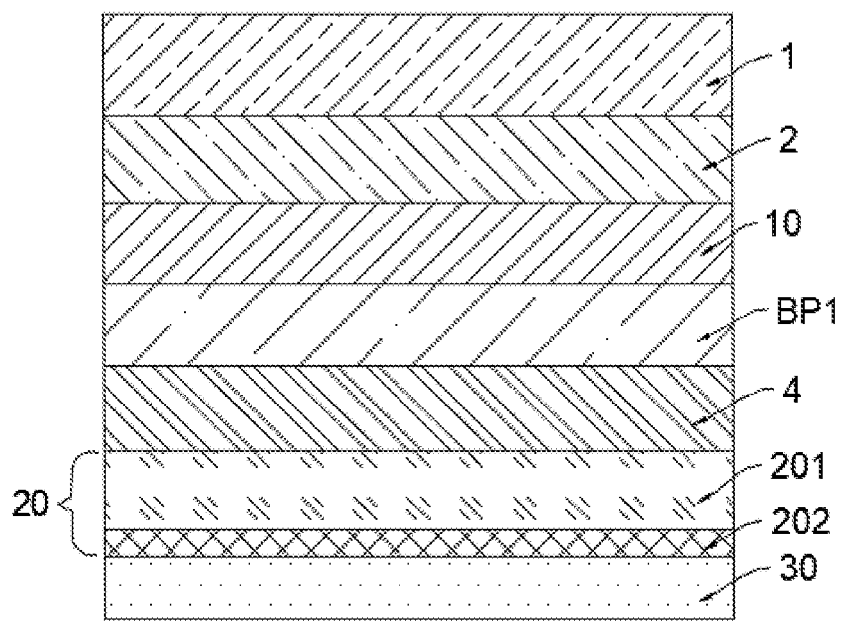
FIG. 1 is a schematic diagram of a display segment stack of a display module proposed by a preferred embodiment of the present disclosure.

To help a person skilled in the art better understand the solutions of the present disclosure, the following clearly and completely describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present disclosure.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

Currently, to achieve a better display effect, improve screen transmission, and reduce power consumption, technology that a polarizer disappears on an organ light-emitting diode (OLED) panel is developed.

Technology that a polarizer disappears on an OLED panel is called color on thin-film encapsulation (COE) technology. The principle of COE technology is to increase a color filter layer on a thin-film encapsulation (TFE) layer. While COE technology shows a better display effect, the shortcomings of the appearance of the display panel easily appears due to the matte effect of the polarizer. Since the metal material is soft due to the super clean foam (SCF) material after the display panel is bent and bound, the display panel is inclined to be deformed, and an imprint on the display panel due to deformation shows when the screen of the display device is closed, resulting in worse user experience for the display module.

In order to solve the technical problem as stated above, the present disclosure proposes a display module and a mobile terminal. A protective layer 30 is arranged on a side of the buffer layer 20 away from the display function layer 10. The protective layer 30 is arranged in a compression overlapping area T so that the protective layer 30 can prevent the metal layer 202 in the buffer layer 20 from being deformed when the display module is compressed. In this way, the compressed display module with color on thin-film encapsulation (COE) technology becomes very attractive in its appearance, and no imprint appears on the closed screen of the display device. Accordingly, the user experience of the display module is enhanced.

Figure 2:
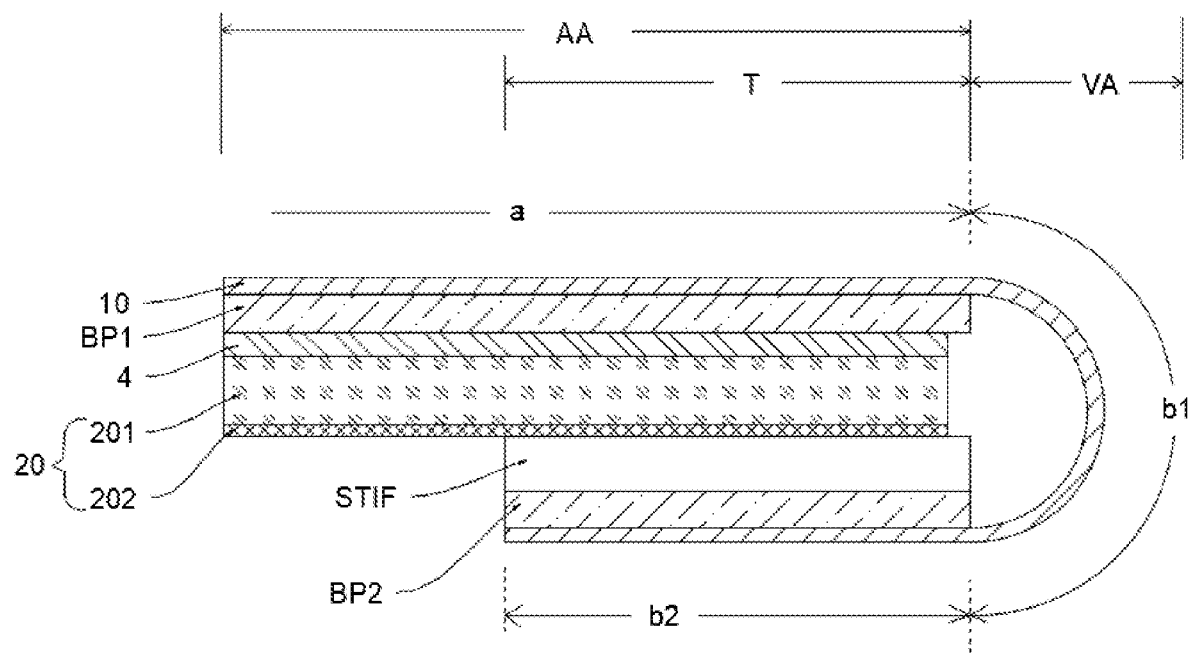
FIG. 2 is a schematic diagram of a bent and bound display module proposed by a preferred embodiment of the present disclosure.

Please refer to FIG. 1 and FIG. 2. The display module includes a display function layer which is divided into a display segment a, a compression segment b2, and a bending segment b1. The display segment a and the compression segment b2 are disposed opposite. The bending section b1 is bent-connected to the display segment a and the compression segment b2. The display module includes a display planar area AA and a binding bending area VA. The display planar area AA includes a compression overlapping area T. A positive projection of the compression segment b2 on the display segment a covers the compression overlapping area T.

The display module includes a display function layer 10 and a buffer layer 20.

The buffer layer 20 covers the compression overlapping area T. The buffer layer 20 is arranged on one side of the display function layer 10 away from an eminent layer of the display function layer 10. The buffer layer 20 includes a metal layer 202.

A protective layer 30 is arranged on one side of the buffer layer 20 away from the display function layer 10. The protective layer 30 covers the compression overlapping area T, and the hardness of a material for the protective layer 30 is greater than the hardness of the material for the metal layer 202.

Please refer to FIG. 2. The display module may be a planar display module, a 2.5D display module, or a 3D display module. The structure of the display module can be designed according to practical needs. Further, the coverage range and form of the display module on the protective layer 30 can be designed according to practical needs as well.

The display module at a display section a may include a cover layer 1, an optical adhesive layer 2, a display function layer 10, a first backplate BP1, a grid adhesive layer 4, a buffer layer 20, and a protective layer 30.

The structure of the pad bending is introduced as an example in the present embodiment. The binding section of the display module is bent and compressed at 180 degrees (180°) in the PAD bending of the display module. The display function layer 10 includes a valid display portion and a non-active display portion. Especially, the valid display portion corresponds to the display segment a of the display module in the present embodiment. The non-active display portion includes a first non-active display portion and a second non-active display portion. The first non-active display portion corresponds to the bending segment b1 of the display module, and the second non-active display portion corresponding to the compression segment b2 of the display module in the present embodiment.

The display module further includes a first backplate BP1 and a grid adhesive. The display function layer 10 may include an organic light-emitting diode (OLED) display function layer 10. The first backplate BP1 is attached to a backlight surface of the display function layer 10. The buffer layer 20 is attached to one side of the first backboard BP1 away from the display function layer 10. The buffer layer 20 may be made of a bonding layer, a bubble layer 201, a polyimide layer, and a metal layer 202 that are sequentially stacked. The metal layer 202 is disposed on one side of the buffer layer 20 away from the display function layer 10.

When the display module is a planar display module, a projection of the buffer layer 20 on the display module covers the display segment a. When the display module is a four-curve display module, the buffer layer 20 overlaps the display segment a of the display module.

A material for the metal layer 202 can be a copper foil or some metallic materials with a good heat-dissipating effect.

Please refer to FIG. 2. The non-active display portion of the display function layer 10 is bent, and then the second non-active display portion is attached to the second backplate BP2 towards one side of the valid display portion. Both the first backplate BP1 is compressed and bound to the protective layer by a reinforcing plate STIF.

The hardness of a material for the protective layer 30 is greater than the hardness of a material for the metal layer 202. For example, the hardness of a material for the protective layer 30 is greater than 150 HV (Hardness according to Vickers) when the metal layer 202 is made of a copper foil. The thickness of the protective layer 30 ranges from 20 to 150 micrometers (um) and may specifically be 20 um, 30 um, 50 um, or 70 um. Practically, the thickness of the protective layer 30 is adjusted according to actual production conditions.

Figure 3:
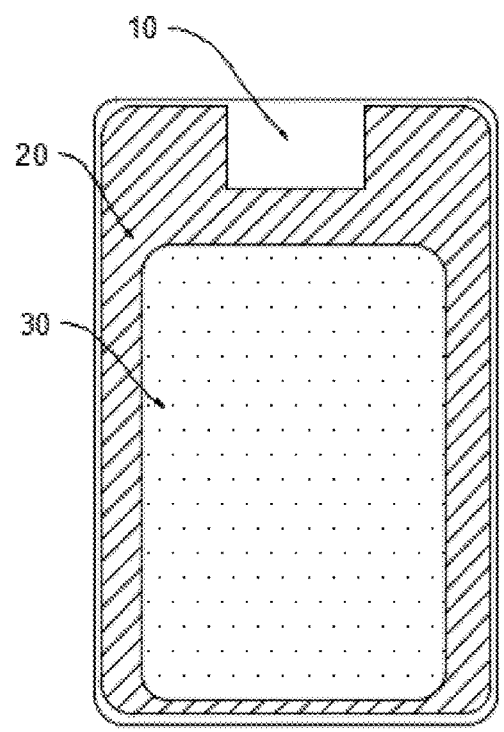
FIG. 3 is a bottom view of a display module proposed by a preferred embodiment of the present disclosure.

Please refer to FIG. 3. The protective layer 30 covers the compression overlapping area T. A projection of the protective layer 30 on the display function layer 10 can also cover most of the display planar area AA.

Because the protective layer 30 is attached to one side of the buffer layer 20 away from the display function layer 10 and the hardness of the protective layer 30 is greater than the hardness of the metal layer 202 in the buffer layer 20, the projection of the protective layer 30 on the display function layer 10 covers the compression overlapping area T. An obvious imprint on the buffer layer 20 is effectively avoided when the buffer layer 20 is compressed due to the low hardness of the metal layer 202 in the buffer layer 20 with COE technology. Instead, the display module becomes very aesthetic and attractive in COE technology, and accordingly, the user experience of the display module is obviously enhanced.

The positive projection of the protective layer 30 on the display segment a is arranged in the display planar area AA of the display module. The protective layer 30 includes a compression portion and a supportive portion. The positive projection of the compression portion on the display segment a covers the compression overlapping area T.

Figure 4:
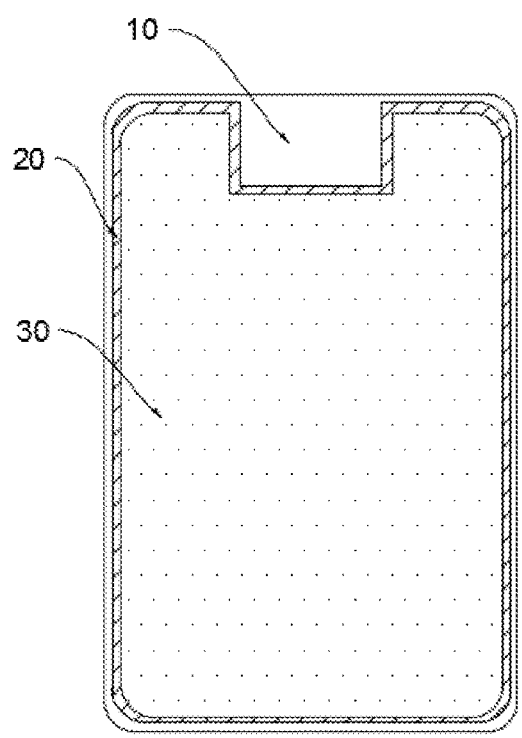
FIG. 4 is a bottom view of a display module proposed by another preferred embodiment of the present disclosure.
Figure 5:
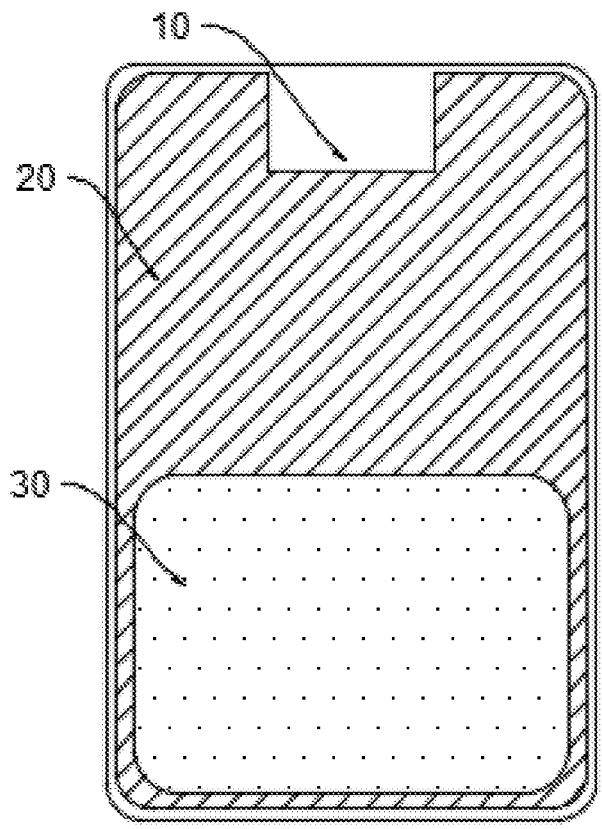
FIG. 5 is a bottom view of a display module proposed by another preferred embodiment of the present disclosure and a protective layer is arranged on one part of the display module.

Please refer to FIG. 4 and FIG. 5. The supportive portion of the protective layer 30 can cover most of the display planar area AA or a part of the display planar area AA. Practically, the supportive portion of the protective layer 30 is adjusted according to actual production conditions.

Owing to the positive projection of the compression portion on the display segment a greater than the compression overlapping area T, the possibility of deformation of the metal layer 202 in the buffer layer 20 in other operational processes is effectively reduced, and further, the display effect of the display module is improved. The user experience of the display module is enhanced accordingly.

The thickness of the compression portion is greater than the thickness of the supportive portion on the protective layer 30

The thickness of the compression portion is greater than the thickness of the supportive portion. The transition from the thickness of the compression portion to the thickness of the supportive portion is uniform.

One side of the protective layer 30 is flat and smooth towards the metal layer 202.

The frequency and strength that the compression portion is affected and extruded is greater than the frequency and strength that the supporting portion is affected and extruded.

To achieve a better heat-dissipating effect, the thickness of the protective layer 30 is appropriately adjusted according to practical compression conditions, which further enhances the service life of the display module and ensures that the display module is attractive in appearance and that user experience is high.

Figure 6:
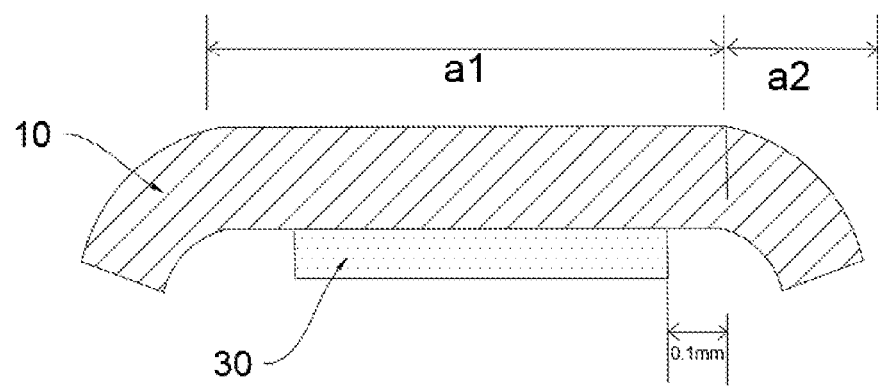
FIG. 6 is a schematic diagram of a protective layer applied in a curve display module according to a first embodiment of the present disclosure.
Figure 7:
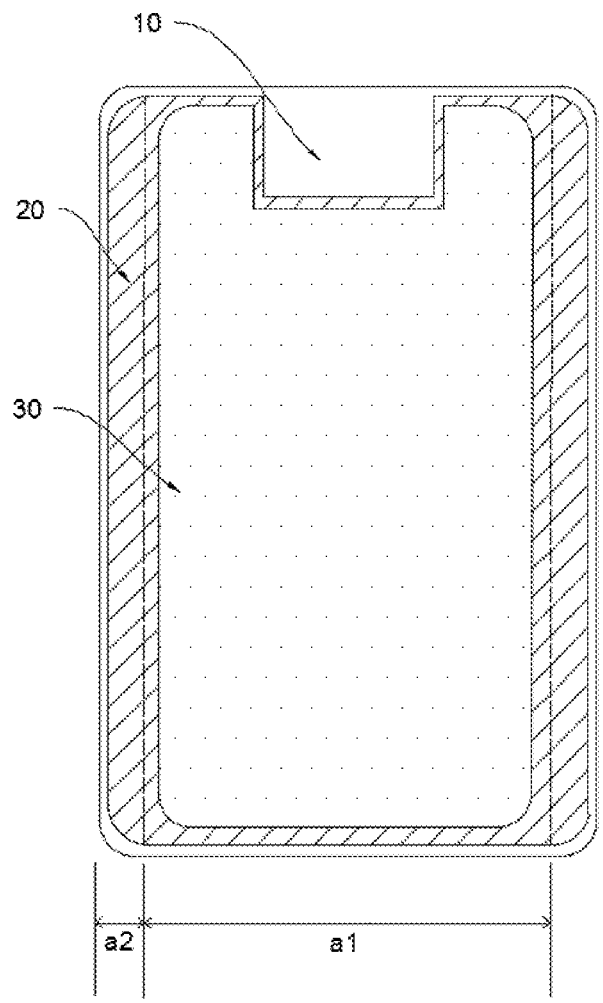
FIG. 7 is a schematic diagram of a protective layer of a curve display module.
Figure 8:
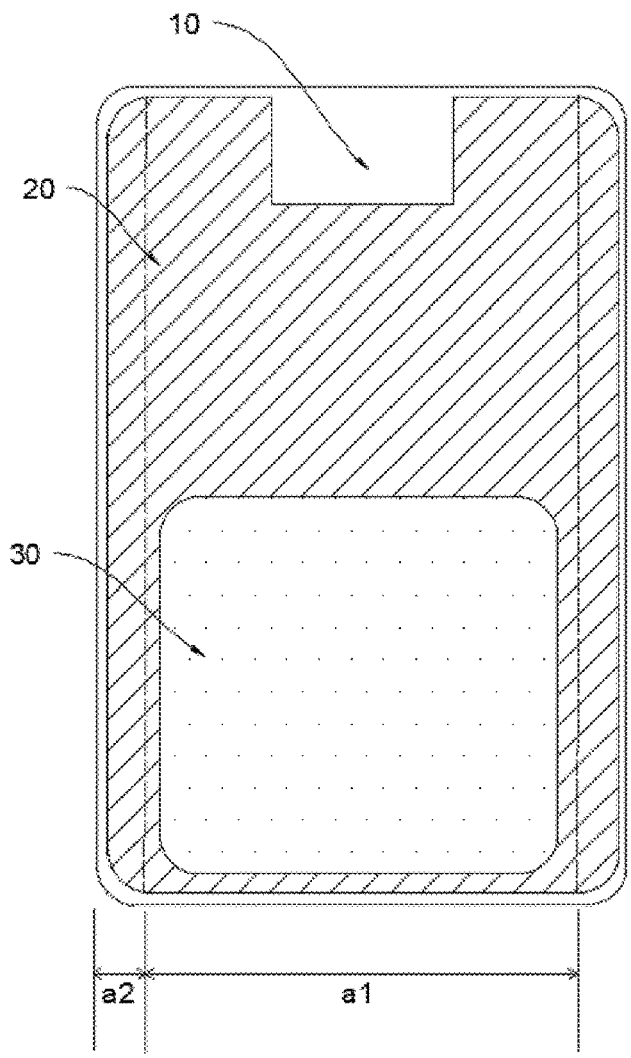
FIG. 8 is a schematic diagram of a protective layer of another curve display module.

Please refer to FIG. 6, FIG. 7, and FIG. 8. The display segment a include a planar valid display portion a1 and a bending valid display portion a2. The display module further includes a display curve area. The planar valid display portion a1 is disposed in the display planar area AA. The bending valid display portion a2 is disposed in display curve area. The distance between the protective layer 30 and the display curve area is greater than 0.1 millimeters (mm).

The display segment a include a planar valid display portion a1 and a bending valid display portion a2. The bending valid display portion a2 in a bending direction forms a predetermined angle with the bending section b1 in a bending direction. Specifically, the predetermined angle is 90 degrees (90°).

When a 2.5 dimensional (2.5D) display panel or a three dimensional (3D) display module is adopted, only the protective layer 30 is disposed on the planar valid display portion a1. Besides, the distance between the protective layer 30 and the display curve area is greater than 0.1 mm to prevent the protective layer 30 from affecting the performance of the bending valid display portion a2. In this way, the display panel with the curve display module maintains flat and smooth with COE technology. Further, the user experience of the display panel with the curve display module is effectively enhanced.

The protective layer 30 includes a main body and a peripheral portion surrounding the main body. The thickness of the peripheral portion of the protective layer 30 towards the periphery of the protective layer 30 becomes smaller and smaller.

The sharp edge of the protective layer 30 with some thickness can prevent the compression power from compression from spreading if the display module is compressed and bound with excessive power. However, the compression power spreading the edge of the protective layer 30 still results in slight deformation of the metal layer 20, causing in user experience of the display module. To solve the above problems, it is necessary to form a compression force transmission transition area on the protective layer 30, reducing the compression accuracy of the compressed and bound display module and further optimizing the product structure.

The protective layer 30 includes a main body and a peripheral portion surrounding the main body. The thickness of the peripheral portion of the protective layer 30 towards the periphery becomes smaller and smaller. Accordingly, the edge of the protective layer 30 forms a valid force transfer transition area, which prevents the hardness of the protective layer 30 from increasing and avoids a compression imprint on the display module due to the excessive compression force from the protective layer 30. Further, the appearance of the compressed display module becomes very attractive, which enhances the user experience of the display module. It is also possible to reduce the fabrication accuracy of the compression process and improve the product yield.

The hardness of a material for the protective layer 30 is greater than 150 HV.

A material for the protective layer 30 may be stainless steel.

The display segment a include a planar valid display portion a1 and a bending valid display portion a2. The display module further includes a display curve area.

The protective layer 30 includes a planar portion and a bending portion. The planar portion corresponds to the planar valid display portion a1. The bending portion corresponds to the bending valid display portion a2. The curve modulus of the bending portion is greater than the curve modulus of the planar portion.

The thickness of the protective layer 30 certainly affects the bending of the bending valid display portion a2. To keep the bending valid display portion a2 flat and smooth in appearance and ensure no imprint on the bending area when the display device is turned off, the protective layer 30 is especially improved in the display bending area. It is easier to bend the protective layer 30 as well.

The curve modulus of the curve portion is greater than the curve modulus of the planar portion, and the curve portion can be set to the following structure. For example, the thickness of the curve portion of the protective layer 30 is designed to be thinner so that it is easier to bend the curve portion of the display curve area than to bend the planar portion. Thus, the effect of the protective layer 30 on the performance of the bending valid display portion a2 reduces. Or, the arrangement of the plurality of hollow holes or blind holes on the curve portion of the protective layer 30 further improves the performance of the bending portion of the protective layer 30.

The structure of the bending layer is improved; that is, the planar portion and the bending portion are arranged on the protective layer 30, so that the curve modulus of the curve portion is greater than the curve modulus of the planar portion and that the protective layer 30 can be attached to the bending valid display portion a2 when being bent. The display module of the display bending area becomes very aesthetic and attractive, and the user experience of the display panel with the curve display module is effectively enhanced. The user experience is obviously improved accordingly.

Figure 9:
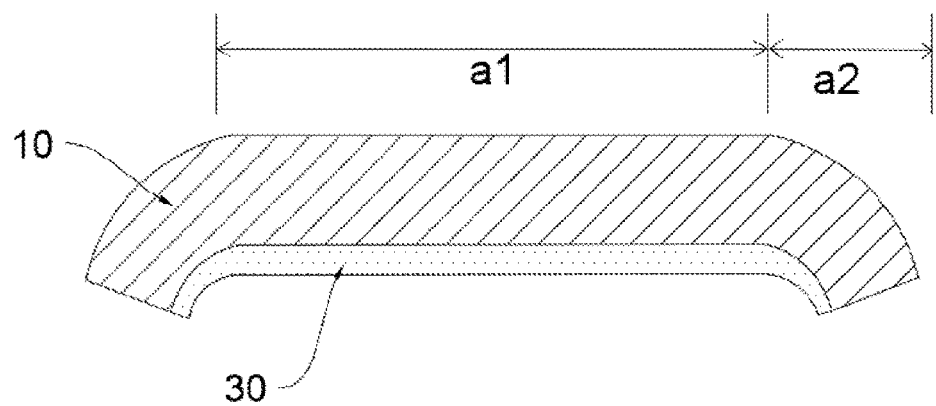
FIG. 9 is a schematic diagram of a protective layer applied in a curve display module according to a second embodiment of the present disclosure.

Please refer to FIG. 9. The thickness of the bending portion is less than the thickness of the planar portion. Besides, a side of the protective layer 30 which is adjacent to the display function layer 10 is attached to the display function layer 10.

The thickness of the bending portion is less than the thickness of the planar portion. The gradient of the thickness between the bending portion and the planar portion may be stepwise or gradual.

If the gradient of the thickness between the bending portion and the planar portion is stepwise, a side of the protective layer 30 near the metal layer 202 is flat and smooth so as to reduce the possibility that the sharp edge of the protective layer 30 compresses the corresponding the metal layer 202 when the protective layer 30 is bent.

The planar portion and the bending portion are arranged on the protective layer 30. The thickness of the bending portion is less than the thickness of the planar portion. The curve modulus of the bending portion is greater than the curve modulus of the planar portion. Thus, the bending portion can be better attached to the bending valid display portion a2 of the display segment a when being bent. The display module of the display bending area becomes very aesthetic and attractive, and the user experience of the display panel with the curve display module with COE technology is effectively enhanced. The user experience is obviously improved accordingly.

Figure 10:
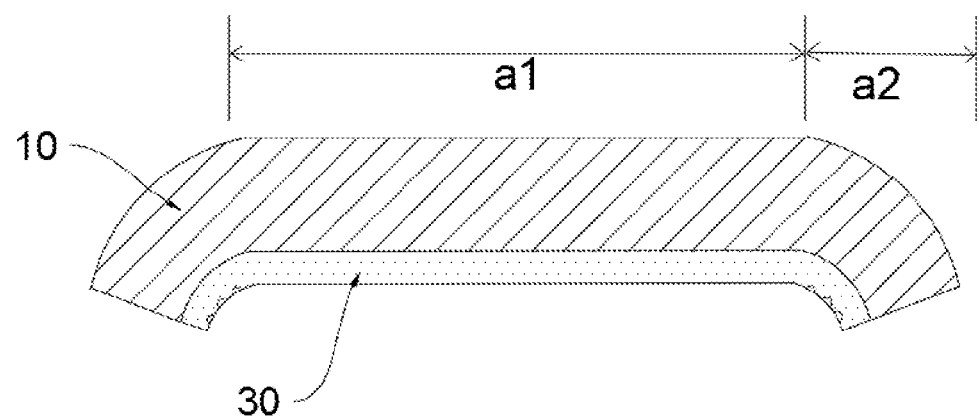
FIG. 10 is a schematic diagram of a protective layer applied in a curve display module according to third embodiment of the present disclosure.

Please refer to FIG. 10 illustrating a plurality of blind holes arranged on the bending portion and openings of the plurality of blind holes disposed on one side of the protective layer 30 away from the buffer layer 20.

The blind hole may be a circular hole or a long-shaped blind hole. For example, a long side of the long-shaped blind hole is parallel to the bending portion of the long-shaped blind hole in a bending direction.

The planar portion and the bending portion are arranged on the protective layer 30. The plurality of blind holes are arranged on the bending portion and the openings of the plurality of blind holes are disposed on one side of the protective layer 30 away from the buffer layer so that the curve modulus of the bending portion can be greater than the curve modulus of the planar portion and that the bending portion of the protective layer 30 can be bent by attaching to the bending valid display portion a2 of the display segment a. The display module becomes very aesthetic and attractive, and the user experience of the display panel with the curve display module is effectively enhanced. The user experience is obviously improved accordingly. In addition, because the openings of the plurality of blind holes are disposed on the side of the protective layer 30 away from the buffer layer 20, the possibility that the sharp edge of the protective layer 30 compresses the corresponding metal layer 202 is lowered when the protective layer 30 is bent.

Further, the present embodiment further proposes a mobile terminal. The mobile terminal includes a display module and a terminal backbone, which are elaborated in any of the embodiments of the present disclosure as introduced above. The terminal backbone and the display module are integrated into one entity.

Above are embodiments of the present invention, which does not limit the scope of the present invention. Any modifications, equivalent replacements or improvements within the spirit and principles of the embodiment described above should be covered by the protected scope of the invention.

What is claimed is:

1. A display module, comprising:
   a display function layer, divided into a display segment, a compression segment, and a bending segment connected between the display segment and the compression segment;
   a display planar area, comprising a compression overlapping area, wherein a positive projection of the compression segment on the display segment covers the compression overlapping area;
   a first backplate, attached to a backlight surface of the display function layer;
   a buffer layer, attached to a side of the first backplate away from the display function layer and covering the compression overlapping area, wherein the buffer layer comprises a metal layer; and
   a protective layer disposed on a side of the buffer layer away from the display function layer, wherein a projection of the protective layer on the display function layer covers the compression overlapping area, and a hardness of a material for the protective layer is greater than a hardness of a material for the metal layer.

2. The display module as claimed in claim 1, wherein a positive projection of the protective layer on the display segment is disposed in the display planar area of the display module; the protective layer comprises a compression portion and a supportive portion; the positive projection of the compression portion on the display segment covers the compression overlapping area.

3. The display module as claimed in claim 2, wherein the thickness of the compression portion is greater than the thickness of the supportive portion.

4. The display module as claimed in claim 1, wherein the display segment comprises a planar valid display portion and a bending valid display portion; the display module further comprises a display curve area; the planar valid display portion is disposed in the display planar area; the bending valid display portion is disposed in display curve area; the distance between the protective layer and the display curve area is greater than 0.1 millimeters (mm).

5. The display module as claimed in claim 1, wherein the protective layer comprises a main body and a peripheral portion surrounding the main body; the thickness of the peripheral portion of the protective layer towards the periphery of the protective layer becomes smaller.

6. The display module as claimed in claim 1, wherein the hardness of a material for the protective layer is greater than 150 HV.

7. The display module as claimed in claim 1, wherein the display segment comprises a planar valid display portion and a bending valid display portion; the display module further comprises a display curve area;
   the protective layer comprises a planar portion and a bending portion; the planar portion corresponds to the planar valid display portion; the bending portion corresponds to the bending valid display portion; the curve modulus of the bending portion is greater than the curve modulus of the planar portion.

8. The display module as claimed in claim 7, wherein the thickness of the bending portion is less than the thickness of the planar portion; a side of the protective layer near the display function layer is attached to the buffer layer.

9. The display module as claimed in claim 7, wherein a plurality of blind holes are disposed on the bending portion; an opening of the blind hole is disposed on a side of the protective layer away from the buffer layer.

10. The display module as claimed in claim 1, wherein the metal layer is made of copper, and the protective layer is made of stainless steel.

11. A mobile terminal, comprising a display module, the display module comprising:
    a display function layer, divided into a display segment, a compression segment, and a bending segment connected between the display segment and the compression segment;
    a display planar area, comprising a compression overlapping area, wherein a positive projection of the compression segment on the display segment covers the compression overlapping area;
    a first backplate, attached to a backlight surface of the display function layer;
    a buffer layer, attached to a side of the first backplate away from the display function layer and covering the compression overlapping area, wherein the buffer layer comprises a metal layer; and
    a protective layer disposed on a side of the buffer layer away from the display function layer, wherein a projection of the protective layer on the display function layer covers the compression overlapping area, and a hardness of a material for the protective layer is greater than a hardness of a material for the metal layer.

12. The mobile terminal as claimed in claim 11, wherein a positive projection of the protective layer on the display segment is disposed in the display planar area of the display module; the protective layer comprises a compression portion and a supportive portion; the positive projection of the compression portion on the display segment covers the compression overlapping area.

13. The mobile terminal as claimed in claim 12, wherein the thickness of the compression portion is greater than the thickness of the supportive portion.

14. The mobile terminal as claimed in claim 11, wherein the display segment comprises a planar valid display portion and a bending valid display portion; the display module further comprises a display curve area; the planar valid display portion is disposed in the display planar area; the bending valid display portion is disposed in display curve area; the distance between the protective layer and the display curve area is greater than 0.1 millimeters (mm).

15. The mobile terminal as claimed in claim 11, wherein the protective layer comprises a main body and a peripheral portion surrounding the main body; the thickness of the peripheral portion of the protective layer towards the periphery of the protective layer becomes smaller.

16. The mobile terminal as claimed in claim 11, wherein the hardness of a material for the protective layer is greater than 150 HV.

17. The mobile terminal as claimed in claim 11, wherein the display segment comprises a planar valid display portion and a bending valid display portion; the display module further comprises a display curve area;

the protective layer comprises a planar portion and a bending portion; the planar portion corresponds to the planar valid display portion; the bending portion corresponds to the bending valid display portion; the curve modulus of the bending portion is greater than the curve modulus of the planar portion.

18. The mobile terminal as claimed in claim 17, wherein the thickness of the bending portion is less than the thickness of the planar portion; a side of the protective layer near the display function layer is attached to the buffer layer.

19. The mobile terminal as claimed in claim 17, wherein a plurality of blind holes are disposed on the bending portion; an opening of the blind hole is disposed on a side of the protective layer away from the buffer layer.

20. The mobile terminal as claimed in claim 11, wherein the metal layer is made of copper, and the protective layer is made of stainless steel.

* * * * *